US012635282B2

(12) United States Patent
    Kinfack Leoga et al.

(10) Patent No.: US 12,635,282 B2
(45) Date of Patent: May 19, 2026

(54) METHOD FOR TREATING A HETEROJUNCTION PHOTOVOLTAIC CELL PRECURSOR

(71) Applicant: COMMISSARIAT À L'ÉNERGIE ATOMIQUE ET AUX ÉNERGIES ALTERNATIVES, Paris (FR)

(72) Inventors: Arnaud Kinfack Leoga, Grenoble (FR); Jordi Veirman, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 648 days.

(21) Appl. No.: 18/006,849

(22) PCT Filed: Jul. 23, 2021

(86) PCT No.: PCT/EP2021/070748
    § 371 (c)(1),
    (2) Date: Jan. 25, 2023

(87) PCT Pub. No.: WO2022/023221
    PCT Pub. Date: Feb. 3, 2022

(65) Prior Publication Data
    US 2023/0275180 A1      Aug. 31, 2023

(30) Foreign Application Priority Data
    Jul. 29, 2020    (FR) ...................................... 2008017

(51) Int. Cl.
    *H10F 71/10*       (2025.01)
    *H10F 10/166*      (2025.01)
    *H10F 71/00*       (2025.01)

(52) U.S. Cl.
    CPC ......... *H10F 71/103* (2025.01); *H10F 10/166* (2025.01); *H10F 71/1221* (2025.01); *H10F 71/134* (2025.01); *Y02E 10/50* (2013.01)

(58) Field of Classification Search
    CPC .. H10F 71/103; H10F 10/166; H10F 71/1221; H10F 71/134; Y02E 10/50;
    (Continued)

(56) References Cited

U.S. PATENT DOCUMENTS

| | | | | |
|---|---|---|---|---|
| 12,224,363 B2 * | 2/2025 | Veirman | ............. | H10F 77/1668 |
| 2021/0376183 A1 * | 12/2021 | Hallam | ................. | H10F 10/165 |
| 2022/0246774 A1 * | 8/2022 | Veirman | ............... | H10F 10/166 |

FOREIGN PATENT DOCUMENTS

| | | |
|---|---|---|
| CN | 110518095 A | 11/2019 |
| EP | 1 734 589 A2 | 12/2006 |

(Continued)

OTHER PUBLICATIONS

International Search Report as issued in International Patent Application No. PCT/EP2021/070748, dated Sep. 17, 2021.

(Continued)

*Primary Examiner* — Earl N Taylor
(74) *Attorney, Agent, or Firm* — CUSHMAN PARTNERS, LLC

(57) ABSTRACT

A method for treating a stack, the stack including a substrate of crystalline silicon, a first passivation layer of hydrogenated amorphous silicon, disposed on a first face of the substrate; and a first layer of n-doped amorphous silicon, disposed on the first passivation layer; the method including a step of exposing the stack to electromagnetic radiation emitted by an electromagnetic radiation source, the first face of the substrate pointing to the electromagnetic radiation source, the electromagnetic radiation having at least one first
(Continued)

wavelength of between 300 nm and 550 nm and at least one second wavelength of between 550 nm and 1100 nm.

14 Claims, 3 Drawing Sheets

(58) Field of Classification Search
CPC . H01L 31/208; H01L 31/0747; H01L 31/202; H01L 31/182
See application file for complete search history.

(56) References Cited

FOREIGN PATENT DOCUMENTS

| EP | 2 963 692 A1 | 1/2016 |
| EP | 3 182 465 A1 | 6/2017 |
| WO | WO 2013/001440 A1 | 1/2013 |
| WO | WO 2020/082131 A1 | 4/2020 |

OTHER PUBLICATIONS

Kobayashi, E., et al., "Increasing the efficiency of silicon heterojunction solar cells and modules by light soaking," Solar Energy Materials and Solar Cells, vol. 173, Jan. 2017, XP002802653, 7 pages.

* cited by examiner

[Fig. 1]
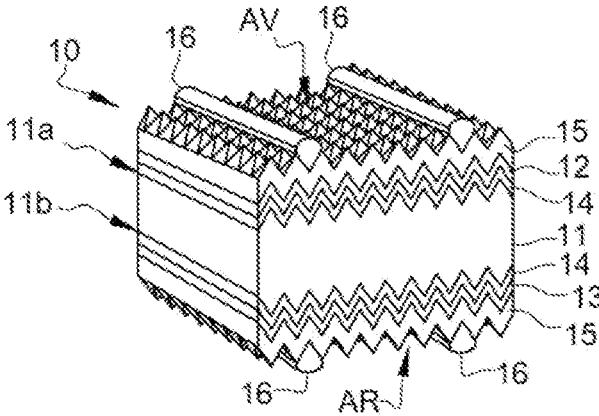
[Fig. 2]
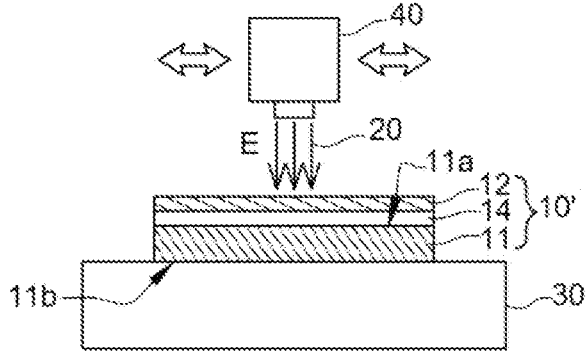
[Fig. 3]
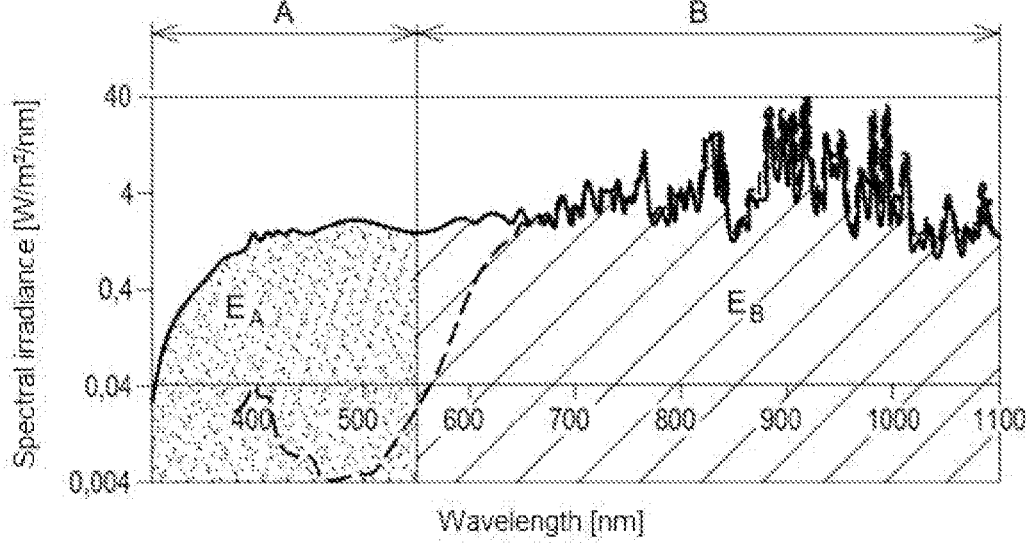

[Fig. 4]
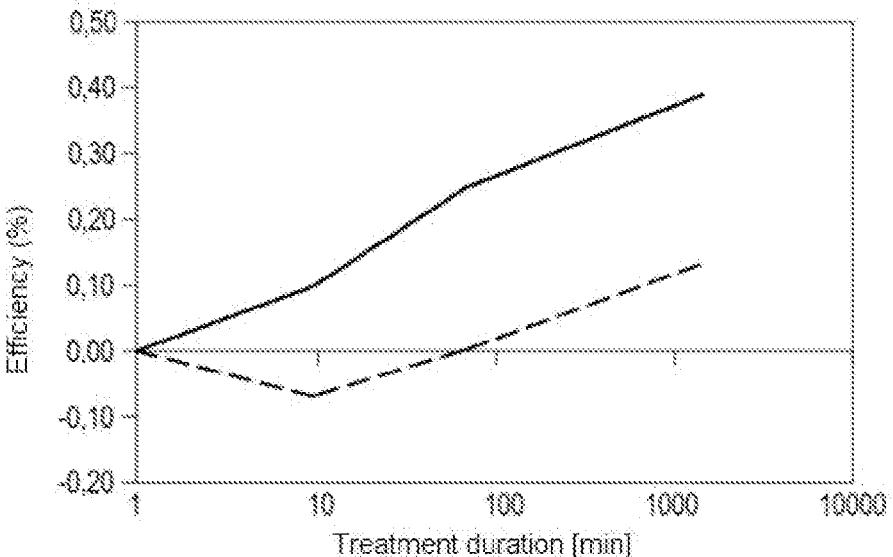
[Fig. 5]
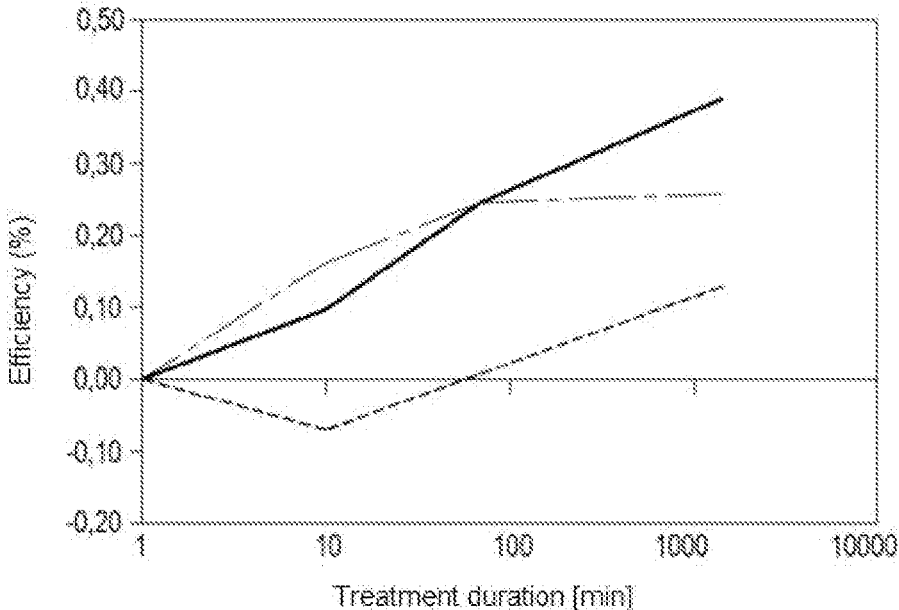

[Fig. 6]
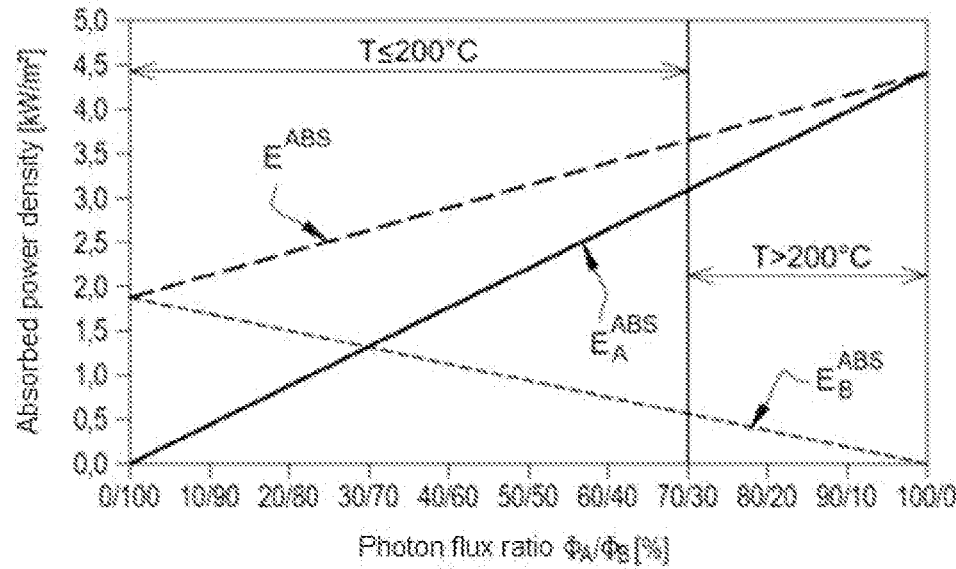
[Fig. 7]
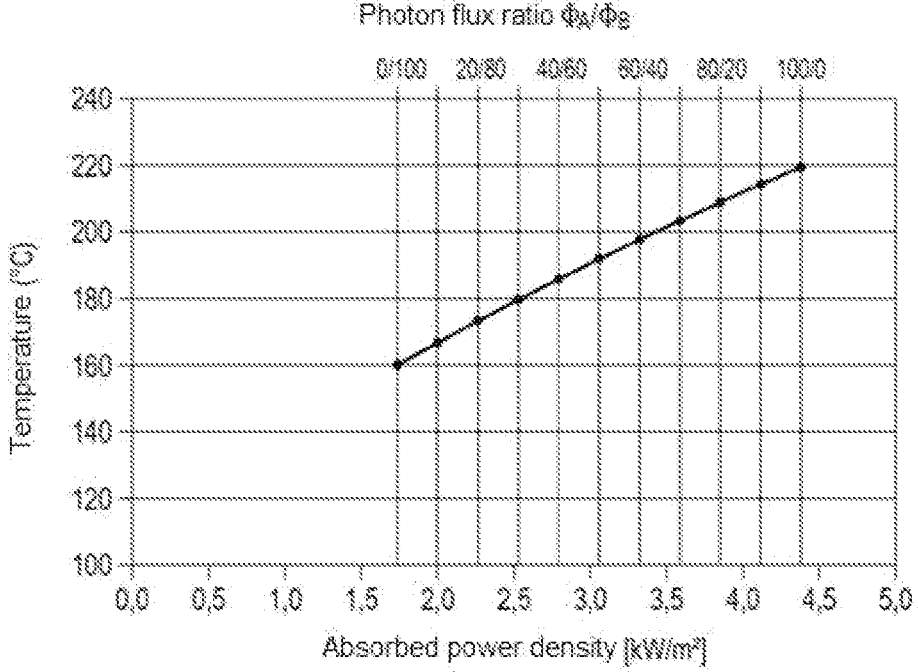

METHOD FOR TREATING A HETEROJUNCTION PHOTOVOLTAIC CELL PRECURSOR

CROSS-REFERENCE TO RELATED APPLICATIONS

This application is the U.S. National Stage of PCT/EP2021/070748, filed Jul. 23, 2021, which in turn claims priority to French patent application number 2008017, filed Jul. 29, 2020. The content of these applications are incorporated herein by reference in their entireties.

TECHNICAL FIELD OF THE INVENTION

The present invention relates to a method for treating a stack obtained upon manufacturing a heterojunction photovoltaic cell, in order to improve and stabilise efficiency of the photovoltaic cell.

TECHNOLOGICAL BACKGROUND OF THE INVENTION

A heterojunction photovoltaic cell is a device capable of absorbing solar radiation and converting it into electric energy. Such a device comprises a p-n junction formed by superimposing two semiconductor materials with different bandgaps, such as crystalline silicon and amorphous silicon.

FIG. 1 represents one example of a silicon heterojunction (SHJ) photovoltaic cell 10. The photovoltaic cell 10 comprises a doped crystalline silicon substrate 11 and two layers of doped amorphous silicon 12, 13 disposed on either side of the substrate 11. One of the doped amorphous silicon layers 12, 13 is doped with the same conductivity type as the substrate 11, for example n-type, and the other layer is doped with the opposite conductivity type, that is p-type.

The heterojunction is formed by the n-doped crystalline silicon substrate 11 and the p-doped amorphous silicon layer, this layer forming the emitter of the photovoltaic cell. The emitter can be located on the front face AV or on the back face AR of the photovoltaic cell.

The photovoltaic cell SHJ is particularly sensitive to defects located at the interface between the crystalline silicon substrate 11 and the doped amorphous silicon layers 12, 13. These defects can be dangling bonds or impurities such as metal ions. They introduce energy levels into the silicon band gap and increase the number of electron-hole recombinations at interfaces, which deteriorates output parameters of the photovoltaic cell, such as the open circuit voltage $V_{OC}$.

In order to achieve a high performance photovoltaic cell, it is therefore necessary to minimise the number of surface recombinations of the substrate 11, which is generally achieved by depositing a passivation layer 14 of intrinsic hydrogenated amorphous silicon onto each face of the substrate 11, prior to the doped amorphous silicon layer 12,13. The hydrogen atoms contained in the passivation layers 14 diffuse to the surface of the substrate 11 and neutralise defects.

Each of the doped amorphous silicon layers 12, 13 is furthermore covered with a layer of Transparent Conductive Oxide 15 (or TOO).

Photovoltaic cell SHJs are known to improve their energy conversion efficiency by about 0.3% absolute under the combined effect of lighting and temperature. This cell "enhancement" phenomenon results from the improvement of one of the hydrogenated amorphous silicon passivation layers 14 and one of the p-doped amorphous silicon layers as well as the improvement of the interfaces between the p-doped amorphous silicon layer and one of the TCO layers 15.

Document WO2013/001440 describes one example of a method for treating a photovoltaic cell SHJ comprising an n-doped crystalline silicon substrate. In this treatment method, the photovoltaic cell is subjected to a luminous flux with irradiance greater than or equal to 500 W/m² for a duration of approximately 10 hours, while being heated to a temperature of between 20° C. and 200° C. Such a treatment duration is incompatible with the output throughput of current photovoltaic cell production lines.

The paper [Increasing the efficiency of silicon heterojunction solar cells and modules by light soaking, E. Kobayashi & al., Solar Energy Materials and Solar Cells, Vol. 173, Pages 43-49, 2017] also discloses a treatment method for increasing the conversion efficiency of a photovoltaic cell SHJ comprising an n-doped crystalline silicon substrate. The method comprises exposing the face comprising a p-doped amorphous silicon layer, called an emitter layer, to standard electromagnetic radiation AM1.5G (solar radiation at sea level). However, the exposure duration allowing an effect to be noticed on the conversion efficiency is about 14 hours.

SUMMARY OF THE INVENTION

There is therefore a need to provide a method for treating a stack obtained upon manufacturing a heterojunction photovoltaic cell for increasing the conversion efficiency enhancement kinetics of the photovoltaic cell.

One aspect of the invention relates to a method for treating a stack, the stack comprising:
- a crystalline silicon substrate;
- a first passivation layer of hydrogenated amorphous silicon, disposed on a first face of the substrate; and
- a first layer of n-doped amorphous silicon, disposed on the first passivation layer.

The method comprises a step of exposing the stack to electromagnetic radiation emitted by an electromagnetic radiation source, the first face of the substrate pointing to the electromagnetic radiation source, the electromagnetic radiation having at least one first wavelength between 300 nm and 550 nm, preferably between 400 nm and 550 nm, and at least one second wavelength between 550 nm and 1100 nm, preferably between 800 nm and 1100 nm, and even more preferably between 900 nm and 1000 nm.

Exposing the stack to electromagnetic radiation results in increasing the open circuit voltage $V_{OC}$ and the form factor of the photovoltaic cell. Thus the conversion efficiency of the photovoltaic cell is improved. For example, treating the stack with radiation according to the invention for 10 minutes results in a gain in the conversion efficiency of the photovoltaic cell equivalent to 12 hours of treatment with radiation of the same intensity (or irradiance) but not having a wavelength in the range from 300 nm to 550 nm. The combination of the first and second wavelengths therefore makes it possible to increase the conversion efficiency enhancement kinetics.

In addition to the characteristics just discussed in the preceding paragraph, the invention according to the first aspect may have one or more of the following additional characteristics, considered individually or in any technically possible combination.

Advantageously, the electromagnetic radiation consists of a first component and a second component, the first component being between 300 nm and 550 nm and the second component being between 550 nm and 1100 nm, at least one of the first and second components being monochromatic. Preferably, the at least one first wavelength belongs to the first component and the at least one second wavelength belongs to the second component.

Advantageously, the at least one second wavelength is between 800 nm and 1100 nm and the electromagnetic radiation has a spectral irradiance between 550 nm and 800 nm less than or equal to 0.04 W/m²/nm.

Advantageously, the electromagnetic radiation has:

a first irradiance measured over the wavelength range between 300 nm and nm;

a second irradiance measured over the wavelength range between 550 nm and 1100 nm;

a total irradiance measured over the wavelength range between 300 nm and 1100 nm; and the first irradiance being greater than 10% of the total irradiance.

Advantageously, the first irradiance is measured over the wavelength range between 400 nm and 550 nm and preferably between 400 nm and 450 nm.

Advantageously, the second irradiance is measured over the wavelength range between 800 nm and 1100 nm and the electromagnetic radiation has a third irradiance measured over the wavelength range between 550 nm and 800 nm less than or equal to 0.1 kW/m².

Advantageously, the first irradiance is associated with the first component and the second irradiance is associated with the second component.

Advantageously, the total irradiance of the electromagnetic radiation is greater than or equal to 1 kW/m², preferably greater than or equal to 1.3 kW/m² and even more preferably greater than or equal to 5 kW/m².

Advantageously, the electromagnetic radiation comprises a first photon flux with a wavelength between 300 nm and 550 nm and a second photon flux with a wavelength between 550 nm and 1100 nm, the ratio of the first photon flux to the second photon flux being less than or equal to 70/30.

Advantageously, the wavelength of the second photon flux is between 800 nm and 1100 nm.

Advantageously, the first photon flux is associated with the first component and the second photon flux is associated with the second component.

Advantageously, the electromagnetic radiation comprises a total photon flux equal to the sum of the first photon flux and the second photon flux, the total photon flux being greater than or equal to $4.83871 \times 10^{21}$ m⁻²·s⁻¹ and preferably greater than or equal to $8.95161 \times 10^{21}$ m⁻²·s⁻¹.

Advantageously, the temperature of the stack is lower than 320° C. during the step of exposing to electromagnetic radiation and preferably lower than 250° C. or even 200° C.

Advantageously, the temperature of the stack is lower than a maximum temperature during the step of exposing to electromagnetic radiation and preferably lower than a critical temperature.

Advantageously, the temperature of the stack during the step of exposing to electromagnetic radiation (20) is substantially equal to 100° C.

Preferably, the exposure step is continuous.

Advantageously, the exposure step is carried out in sequences in order to limit heating of the stack.

Advantageously, the stack further comprises a transparent conductive oxide layer disposed on the first layer of doped amorphous silicon.

Advantageously, the stack comprises:

a second passivation layer of hydrogenated amorphous silicon, disposed on a second face of the substrate, the second face of the substrate being opposite to the first face of the substrate; and a second layer of p-doped amorphous silicon, disposed on the second passivation layer.

Advantageously, the stack further comprises a second layer of doped p-type amorphous silicon, the second layer of doped amorphous silicon being also disposed on the first passivation layer.

The invention further relates to a method for manufacturing a silicon heterojunction cell, comprising the following steps of:

forming a stack by depositing a first passivation layer of hydrogenated amorphous silicon onto a first face of a crystalline silicon substrate and a first layer of n-doped amorphous silicon on the first passivation layer; and exposing the stack to electromagnetic radiation emitted by the electromagnetic radiation source, the first face of the substrate pointing to the electromagnetic radiation source, the electromagnetic radiation having at least one first wavelength between 300 nm and 550 nm and at least one second wavelength between 550 nm and 1100 nm.

The manufacturing method makes it possible to provide a silicon heterojunction cell enhanced, that is with better conversion efficiency. Exposure to electromagnetic radiation comprising two wavelengths makes it possible to increase enhancement kinetics. Thus, the method makes it possible to manufacture enhanced heterojunction cells at an industrial throughput.

The invention also relates to a method for treating a photovoltaic module, the photovoltaic module comprising at least two electrically connected silicon heterojunction photovoltaic cells, each silicon heterojunction photovoltaic cell comprising a stack, the stack comprising:

a crystalline silicon substrate;

a first passivation layer of hydrogenated amorphous silicon, disposed on a first face of the substrate; and a first layer of n-doped amorphous silicon, disposed on the first passivation layer;

The method for treating the photovoltaic module being remarkable in that it comprises a step of exposing each stack to electromagnetic radiation emitted by a source of electromagnetic radiation, each first face of the substrate pointing to the source of electromagnetic radiation, the electromagnetic radiation having at least one first wavelength of between 300 nm and 550 nm and at least one second wavelength of between 550 nm and 1100 nm The treatment method allows the heterojunction cells forming the photovoltaic module to be enhanced. The method can be carried out before or after the heterojunction cells are encapsulated. In the latter case, these are heterojunction cells forming a finished photovoltaic module, for example. The treatment method applied to a finished photovoltaic module makes it possible to increase the conversion efficiency of said photovoltaic module when it is at the end of manufacturing or after installation.

The invention and its different applications will be better understood upon reading the following description and examining the accompanying figures.

BRIEF DESCRIPTION OF THE FIGURES

The figures are set forth by way of indicating and in no way limiting purposes for the invention.

FIG. 1 is a schematic perspective view of an example of a heterojunction photovoltaic cell.

FIG. 2 schematically represents a method for treating a stack according to the first aspect of the invention.

FIG. 3 represents two spectral irradiance curves of three electromagnetic radiations emitted from three different sources.

FIG. 4 represents two efficiency curves of stacks that have undergone the treatment method.

FIG. 5 represents the efficiency gain of a stack that has undergone the treatment method.

FIG. 6 represents the irradiance received by a stack as a function of a photon flux ratio.

FIG. 7 represents the change in temperature of a stack as a function of the absorbed power density and the photon flux ratio.

For the sake of clarity, identical or similar elements are marked with identical reference signs throughout the figures.

DETAILED DESCRIPTION

FIG. 2 schematically represents a method for treating a stack 10' used to manufacture a heterojunction photovoltaic cell. The stack 10' may be a heterojunction photovoltaic cell precursor, that is an intermediate product obtained upon manufacturing a heterojunction photovoltaic cell, or a heterojunction photovoltaic cell completed (that is ready for interconnection with other heterojunction photovoltaic cells). The stack 10' comprises a crystalline silicon (c-Si) substrate 11, a first passivation layer 14 disposed on a first face 11a of the substrate 11 and a first layer of doped amorphous silicon disposed on the first passivation layer 14.

The crystalline silicon substrate 11 can be n-type or p-type doped. When the crystalline silicon substrate 11 is n-doped, only donor dopant impurities (for example phosphorus atoms) have been intentionally introduced into the crystalline silicon of the substrate 11 in order to modify its electrical conductivity. In addition to donor dopant impurities, the substrate 11 may unintentionally (and therefore in trace amounts) contain acceptor type dopant impurities (such as boron atoms). The concentration of acceptor-type doping impurities $N_A$ of the substrate 11 is advantageously lower than $10^{13}$ $cm^{-3}$, preferably lower than $3.10^{12}$ $cm^{-3}$. The concentration of donor-type doping impurities $N_D$ is preferably greater than 50 times the concentration of acceptor-type doping impurities $N_A$ (or $N_D/N_A > 50$). Similarly, when the crystalline silicon substrate 11 is p-doped, only acceptor dopant impurities have been intentionally introduced, such as boron, gallium or indium atoms.

The first passivation layer 14 is of hydrogenated amorphous silicon (a-Si:H). The hydrogenated amorphous silicon of the first passivation layer 14 is preferably intrinsic, that is not intentionally doped. Intrinsic hydrogenated amorphous silicon indeed provides better chemical passivation of crystalline silicon surfaces than doped hydrogenated amorphous silicon.

The first layer 12 of doped amorphous silicon is n-doped, for example by introducing donor impurities, such as phosphorus atoms. In the same way as the substrate 11, in addition to donor type dopant impurities, the first layer 12 of doped amorphous silicon may unintentionally contain trace amounts of acceptor type dopant impurities.

With reference to FIG. 2, the treatment method comprises a step of exposing the stack 10' to electromagnetic radiation 20 for a treatment duration t which is advantageously a function of the total irradiance E of the electromagnetic radiation 20 and the wavelength λ (or wavelengths) of the electromagnetic radiation 20. The total irradiance E, also called energy lighting or light power surface density, represents the power of the electromagnetic radiation received by a unit area, this unit area being oriented perpendicularly to the direction of the electromagnetic radiation.

The exposure step, also referred to as the illumination or irradiation step, can be accomplished by disposing the stack 10' on a support 30 and under a radiation source 40. The electromagnetic radiation 20 emitted by the source 40 is preferably directed perpendicular to the surface of the stack 10'.

The first face 11a of the substrate 11, covered with the first passivation layer and the first layer 12 of doped amorphous silicon, points to the radiation source 40, as illustrated in FIG. 2.

Exposing the stack 10' to electromagnetic radiation 20 results in increasing the open circuit voltage $V_{OC}$ and the form factor (FF) of the photovoltaic cell obtained from the stack 10' and consequently increasing its conversion efficiency.

In order to improve the conversion efficiency of the cell, it is not useful to expose more than one face of the stack 10' to the electromagnetic radiation 20. Instead, this face of the stack 10' may be fully illuminated. Preferably, all regions of the exposed face of the stack 10' receive the electromagnetic radiation 20 during the same treatment duration t.

The support 30 may be fixed or movable and designed to support one or more stacks (10'). It may be coupled to a cooling system (not represented), in order to keep temperature of the stack 10' below 320° C. when the treatment duration between 200° C. and 320° C. does not exceed 1 second and preferably below 200° C. during the whole treatment duration t. Indeed, after several seconds spent above 200° C., amorphous silicon of the first passivation layer 14 degrades irremediably, leading to a decrease in the performance of the photovoltaic cell. However, the treatment duration between 200° C. and 320° C. before degradation of the first passivation layer 14 can positively or negatively vary depending on the deposition method used. For example, the substrate 30 is cooled by circulating a heat transfer fluid or by means of Peltier elements.

Even more advantageously, the temperature of the stack 10' is kept below or substantially equal to 200° C. By the expression "keeping the temperature substantially equal to 200° C.", it is meant that the maximum temperature of the stack 10' is within a range of ±5% around 200° C., that is between 190° C. and 210° C.

Advantageously, the temperature of the stack 10' is kept below a maximum temperature and preferably below a critical temperature. The maximum temperature corresponds to the temperature above which the stack 10' experiences instantaneous irreversible damage. The critical temperature is the highest temperature at which the stack 10' will not be damaged, regardless of how long it is kept at this temperature. The stack 10' can withstand a temperature between the critical temperature and the maximum temperature, but the duration of exposure to this temperature is limited. For example, said duration is less than 1 second when the temperature of the stack is substantially lower than the maximum temperature. Said duration may be longer than several seconds, for example several minutes, when the temperature of the stack is substantially higher than the critical temperature. Indeed, beyond a certain amount of accumulated energy, the amorphous silicon of the first passivation layer 14 degrades irremediably, leading to a decrease in the performance of the photovoltaic cell. The critical temperature can positively or negatively vary depending on the deposition method used. For example, some deposition methods can provide stacks 10' with a critical temperature of 250° C. On the other hand, the critical temperature is rarely observed below 200° C. The critical temperature is preferably between 200° C. and 250° C., for example between 230° C. and 240° C. The maximum temperature, on the other hand, varies little in dependence on the deposition method used and is, for example, 320° C.

The cooling system (not shown), then, advantageously keeps the temperature of the stack 10' below the critical temperature for the entire treatment duration and preferably the temperature of the stack 10' between the critical temperature and the maximum temperature for less than one second.

Even more advantageously, the temperature of the stack 10' is kept below or substantially equal to the critical temperature. By the expression "keeping the temperature substantially equal to the critical temperature", it is meant that the maximum temperature of the stack 10' is within a range of ±5% around the critical temperature, for example between 240° C. and 260° C. when the critical temperature is equal to 250° C.

The support 30 can especially be a substrate holder or a conveyor capable of transporting several stacks 10' simultaneously.

The radiation source 40 may be a laser system comprising, for example, one or more laser arrays, a set of light emitting diodes or any other device capable of emitting electromagnetic radiation whose total irradiance E is advantageously greater than 1 kW-m$^{-2}$. Preferably the total irradiance E is greater than 1.3 kW-m$^{-2}$ and even more preferably greater than 5 kW-m$^{-2}$, for example equal to 200 kW-m$^{-2}$.

A system for moving the support 30 or the source 40 may be provided in order to relatively translationally move the support 30 and the source 40. Such a translational system makes it possible to expose an entire face of the stack 10' in the case of a source 40 having an illumination surface area smaller than the surface area of the face of the stack 10' (especially in the case of a laser system). It also allows several stacks 10' to be illuminated successively, these stacks being disposed on the same support, for example.

The electromagnetic radiation 20 may be polychromatic, that is it may have several (monochromatic) components with different wavelengths.

More precisely, the electromagnetic radiation 20 has at least one first wavelength between 300 nm and 550 nm and preferably between 400 nm and 550 nm and even more preferably between 400 nm and 450 nm. In these ranges, the radiation is at least partially absorbed in the first few hundred nanometres of the stack 10', thereby improving quality of the first passivation layer 14 of hydrogenated amorphous silicon and the first amorphous silicon doped layer 12. Very short wavelengths, below nm, are highly energetic and may present a risk of degradation to the passivation layer, in which case restricting the wavelength range to between 400 nm and 550 nm limits the risk of degradation. The longer the wavelength of the radiation, the less efficiently the radiation is absorbed. A wavelength range between 400 and 450 nm is a good compromise in terms of absorption (and thus treatment efficiency) and limiting the risk to the passivation layer.

The electromagnetic radiation 20 may also have at least one second wavelength between 550 nm and 1100 nm. In this range, the radiation is at least partially absorbed in the crystalline substrate, resulting in a decrease in the number of interface states between the crystalline substrate 11 and the first and second passivation layers 14, respectively. In other words, the number of neutralised interface defects increases and quality of the passivation improves. In order to increase absorption of electromagnetic radiation 20, the second wavelength is preferably between 800 nm and 1100 nm or between 900 nm and 1100 nm. Between 1000 nm and 1100 nm, transparency of the stack 10' increases, reducing the effectiveness of the method, so it may be advantageous that the second wavelength is between 900 nm and 1000 nm.

Carrying out the treatment only with radiation comprising only the first wavelength makes it possible to improve quality of the amorphous layers 12, 14, however the short wavelength radiation may cause excessive heating of the stack 10'. In order to limit heating, the intensity of the radiation comprising only the first wavelength can be reduced, also in order to reduce heating. On the other hand, this solution also reduces the enhancement kinetics of the amorphous layers 12, 14. At equal intensity, the radiation 20 comprising the first wavelength and the second wavelength offers the advantage of reducing the intensity associated with the first wavelength, thereby reducing heating associated with the first wavelength, which is not cancelled out by heating associated with the second wavelength. The radiation 20 thus benefits from improvements associated with the first wavelength and the second wavelength, providing high improvement kinetics while limiting heating of the stack 10'.

In order to further improve the treatment kinetics while limiting heating, it is advantageous that the electromagnetic radiation 20 is negligible or even zero between nm and 800 nm. Indeed, in this wavelength range, the treatment effectiveness of the first passivation layer 14 and the first doped layer 12 is lower, while heating caused is still high. It is therefore preferable to limit the energy input between 550 nm and 800 nm. For this, the electromagnetic radiation 20 preferably has a negligible spectral irradiance between 550 nm and 800 nm, that is less than or equal to 0.04 W/m$^2$/nm. A spectral irradiance of less than or equal to 0.04 W/m$^2$/nm can be achieved by filtering the electromagnetic radiation, cutting off all wavelengths between 550 nm and 800 nm.

The second length is therefore preferably between 800 nm and 1100 nm.

The electromagnetic radiation 20, regardless of whether it is monochromatic or polychromatic, has a first irradiance $E_A$ and a second irradiance $E_B$ as illustrated in FIG. 3. The first irradiance $E_A$ is measured over the wavelength range between 300 nm and 550 nm. The second irradiance $E_B$ is measured over the wavelength range between 550 nm and 1100 nm. The spectral irradiance $E(\lambda)$ is a function of wavelength $\lambda$ and is expressed in W/m$^2$/nm. The first irradiance $E_A$ corresponds to the integration of the spectral irradiance $E(\lambda)$ between 300 nm and 550 nm. Similarly, the second irradiance $E_B$ corresponds to the integration of the spectral irradiance $E(\lambda)$ between 550 nm and 1100 nm.

By way of example, FIG. 3 shows two spectral irradiance curves $E(\lambda)$ of two electromagnetic radiations emitted by different sources. The solid line curve represents the spectral irradiance $E(\lambda)$ of a radiation emitted by an unfiltered xenon source (hereafter referred to as an unfiltered radiation). The dashed line curve represents the spectral irradiance $E(\lambda)$ of radiation emitted by a filtered xenon source (hereafter referred to as filtered radiation). The filtered and unfiltered radiations are emitted by the same source comprising, in the first case, an optical filter cutting off wavelengths below 550 nm, and in the second case, no optical filter.

The unfiltered radiation (solid line) has a non-zero spectral irradiance $E(\lambda)$ between 300 nm and 550 nm and greater than 0.4 W/m$^2$/nm between 350 nm and 550 nm. The filtered radiation (dashed line) has a negligible spectral irradiance $E(\lambda)$ between 300 nm and 550 nm. The filtered and unfiltered radiations have (to within ±5%) substantially the same spectral irradiance values $E(\lambda)$ between 650 nm and 1100 nm.

The wavelength ranges associated with the first and second irradiances $E_A$, $E_B$ are hatched and differentiated by the letters A and B in FIG. 3. The total irradiance E is measured over the wavelength range from 300 nm to 1100 nm, spanning the ranges A and B. The unfiltered radiation has a first irradiance $E_A$ and second irradiance $E_B$ which are non-zero. The filtered radiation has a negligible first irradiance $E_A$ and a second irradiance $E_B$ substantially equal (to within ±5%) to the second irradiance $E_B$ of the unfiltered radiation.

It is advantageous to define a third irradiance, measured between 550 nm and 800 nm. The third irradiance preferably corresponds to the integration of the spectral irradiance $E(\lambda)$ between 550 nm and 800 nm. The second irradiance $E_B$ is then preferably measured between 800 nm and 1100 nm.

In order to reduce heating during the heat treatment while improving treatment kinetics, the third irradiance is preferably less than or equal to 0.1 kW/m². The third irradiance is, for example, obtained by filtering the electromagnetic radiation cutting all wavelengths in a window extending from 550 nm to 800 nm so that the maximum spectral irradiance of the radiation is less than or equal to 0.04 W/m²/nm.

Heat treatment by means of an electromagnetic radiation similar to solar radiation is less advantageous. Indeed a radiation source according to the AM1.5 G (Air Mass 1.5 Global) standard emits an electromagnetic radiation with a high proportion of the energy emitted between 550 nm and 800 nm. Moreover, photons in this range are less effective in improving the photo-electronic characteristics of the stack, but do cause significant heating. It is then necessary to actively cool the stack by means of a cooling system or to reduce the total irradiance emitted, further reducing the treatment kinetics. Thus, limiting the spectral irradiance between 550 nm and 800 nm to 0.04 W/m²/nm, that is to an irradiance less than or equal to 0.1 kW/m², makes it possible to improve the treatment kinetics while simplifying the implementation of the method (absence of cooling means for example).

The stack 10' advantageously comprises a second passivation layer (not represented in FIG. 2) disposed on a second face 11b of the substrate 11, opposite to the first face 11a. The second passivation layer may be made of intrinsic hydrogenated amorphous silicon, silicon nitride, aluminium oxide, titanium oxide or silicon oxide. Like the first passivation layer 14, the second passivation layer helps to reduce the number of electron-hole pair recombinations on the surface of the substrate 11, thereby increasing the level of injection into the stack 10' during the illumination step (and subsequent operation of the photovoltaic cell).

The stack 10' may also include a second layer of p-doped amorphous silicon (similar to the second amorphous silicon layer 13 represented in FIG. 1), for forming the emitter of the photovoltaic cell and disposed on the second passivation layer.

In one implementation of the treatment method, the stack 10' is of the type represented in FIG. 1 and comprises:
the crystalline silicon substrate 11;
the first passivation layer 14 of hydrogenated amorphous silicon (and preferably intrinsic) disposed on the first face 11a of the substrate 11;
the first layer 12 of doped amorphous silicon, disposed on the first passivation layer 14 and n-type doped;

a first transparent conductive oxide layer 15 disposed on the first layer 12 of doped amorphous doped silicon;
the second passivation layer 14 of hydrogenated amorphous silicon (preferably intrinsic) disposed on the second face 11b of the substrate 11;
the second layer 13 of doped amorphous silicon, disposed on the second passivation layer 14 and p-type doped; and
a second transparent conductive oxide layer 15 disposed on the second layer 13 of doped amorphous doped silicon.

Such a heterojunction photovoltaic cell stack or precursor is said to be asymmetric because of the two layers 12, 13 of doped amorphous silicon, doped with opposite conductivity types and disposed on either side of the substrate 11. The amorphous silicon of the first and second doped layers 12, 13 is preferably hydrogenated.

FIG. 4 shows the average conversion efficiency gains of a plurality of stacks 10', part of said plurality having undergone treatment implementing unfiltered radiation (solid line) and the other part of said plurality having undergone treatment using filtered radiation (dashed line). The radiations have total irradiances E between 1 kW/m² and kW/m², however the results of FIG. 4 remain valid for higher irradiances, for example higher than 5 kW/m², as long as the temperature of the stacks 10' is kept lower than 320° C. and preferably lower than or substantially equal to 200° C. Additionally, it is more advantageous that the temperature of the stacks 10' is kept below the maximum temperature and preferably below or substantially equal to the critical temperature.

The average efficiency gains are plotted against the treatment duration t and normalised to zero before treatment. In both cases, the treated stacks are kept at the same temperature.

The stacks 10' treated with filtered radiation (broken line) show a reduction in efficiencies in the first few minutes of treatment and an increase in efficiencies beyond one hour of treatment to show an average gain of over 0.1% after 24 hours of treatment. The stacks 10' treated with unfiltered radiation (solid line) show an increase in efficiencies from the first few minutes of treatment and show an average gain of 0.1% after only 10 minutes of treatment. The increase in efficiency continues as a function of treatment duration to show an average efficiency gain of approximately 0.4% after 24 hours of treatment.

For example, treating a stack 10' with unfiltered radiation for 10 minutes provides a gain in efficiency equivalent to 24 hours of treatment with filtered radiation. The difference between the filtered and unfiltered radiation is the presence of at least one wavelength component between 300 nm and 550 nm for the unfiltered radiation. Thus, the implementation in the treatment method of a radiation with at least one wavelength between 300 nm and 550 nm makes it possible to increase the conversion efficiency gain kinetics and thus to reduce the treatment duration, thus making the treatment compatible with an industrial throughput.

FIG. 5 shows the influence of the first irradiance $E_A$ on the average efficiency gains obtained in FIG. 4, in other words, the influence of at least one first wavelength between 300 nm and 550 nm. The increase in efficiency, when the treatment method implements unfiltered radiation (solid line), comprises on the one hand a gain associated with the first irradiance $E_A$ and on the other hand a gain associated with the second irradiance $E_B$. For this, a comparison (subtraction) is carried out between the averages of the efficiency gains obtained by implementing filtered (dashed line) and unfiltered (solid line) radiations for obtaining the efficiency increase resulting solely from the first irradiation $E_A$. The efficiency associated with the first irradiation $E_A$ is marked by the mixed line curve. The increase in efficiency associated with the first irradiance $E_A$ is effective from the first minutes of treatment, allowing in particular to compensate for the efficiency reduction due to the second irradiance $E_B$. Thus, the treatment of a stack 10' with radiation comprising at least one wavelength between 300 nm and 550 nm makes it possible to increase the efficiency of the stack 10'.

Wavelengths below 550 nm are absorbed by the first few hundred nanometres of the stack and interact with the top layers of the stack 10', that is the first passivation layer 14, the first layer 12 of doped amorphous silicon and, according to one embodiment of the method, the first transparent conductive oxide layer 15. Energy dissipated by the short wavelengths has the effect of improving quality of the layers 12, 14, 15 as well as the interfaces between these layers thereby reducing the series resistance within the stack 10'. The reduction in series resistance of the stack 10' increases the form factor of the photovoltaic cell and its conversion efficiency.

The stack 10' may comprise, in addition to the first transparent conductive oxide layer 15, metallisations 16, disposed on the first transparent conductive oxide layer 15. Energy dissipated in the first transparent conductive oxide layer 15 also makes it possible to improve the interface between the first transparent conductive oxide layer 15 and the metallisations 16, further reducing the series resistance within the stack 10'.

The implementation of radiation 20 comprising at least one wavelength between 300 nm and 550 nm makes it possible to reduce the treatment duration t. However, photons of short wavelengths are energetic and have a high probability of absorption, thus heating up the stack 10'. In order not to degrade the amorphous silicon layers 12, 13, 14, it is preferable to limit temperature of the stack 10' to less than 200° C. However, according to the manufacturing method for depositing the amorphous silicon layers 12, 13, 14 and their quality, the temperature limit of the stack 10' not causing a degradation can be slightly higher than 200° C., for example up to 235° C. However, if degradation of the amorphous silicon layers is to be expected, the temperature of the stack 10' may be between 200° C. and 270° C. for 10 minutes or between 270° C. and 280° C. for 2 seconds or between 280° C. and 320° C. for a maximum of 1 second.

In order not to degrade the amorphous silicon layers 12, 13, 14, it may also be advantageous to limit temperature of the stack 10' below the critical temperature. However, according to the manufacturing method for depositing the amorphous silicon layers 12, 13, 14 and their quality, the critical temperature limit may vary. The temperature of the stack 10' is preferably between the critical temperature and 270° C. for 10 minutes or between 270° C. and 280° C. for 2 seconds or between 280° C. and the maximum temperature for a maximum of 1 second.

Powers dissipated by the radiation 20 as a function of wavelength can be adjusted to limit heating of the stack 10'. The first irradiance $E_A$ can for example be reduced in favour of the second irradiance $E_B$. For example, the first irradiance $E_A$ may be 10% to 30% of the total irradiance E. However, in order to maintain good enhancement kinetics, the first irradiance $E_A$ is advantageously maintained above 10% of the total irradiance E.

FIGS. 6 and 7 show simulation results of the heating of the stack 10' of the type shown in FIG. 1 treated with radiation 20 comprising only two monochromatic components, a first wavelength equal to 400 nm and a second wavelength equal to nm. The radiation has a total absorbed photon flux $\phi_T$ equal to $8.95161 \times 10^{21}$ photon/m²/s. The total absorbed photon flux $\phi_T$ comprises a first absorbed photon flux $\phi_A$ having a first wavelength of 400 nm and a second absorbed photon flux $\phi_B$ having a second wavelength of 1000 nm. The total absorbed photon flux $\phi_T$ is equal to $\phi_T = \phi_A + \phi_B$ and is constant. In particular, FIG. 6 shows the absorbed power density or total absorbed irradiance $E^{ABS}$ of the radiation 20 as a function of the ratio between the first and second absorbed photon fluxes $\phi_A/\phi_B$. The first absorbed irradiance $$E_A^{ABS}$$

depends on the irradiance $E_A$ (comprising absorbed, transmitted and reflected irradiances) and the first absorbed photon flux $\phi_A$ according to:

$$E_A^{ABS} = E_A \times \text{absorption coefficient} = \phi_A \times \frac{hc}{\lambda_{400}} \qquad \text{[Math 1]}$$

Similarly, the second absorbed irradiance $$E_B^{ABS}$$

depends on the irradiance $E_B$ (including absorbed, transmitted and reflected irradiance) and the second absorbed photon flux $\phi_B$ according to:

$$E_B^{ABS} = E_B \times \text{absorption coefficient} = \phi_B \times \frac{hc}{\lambda_{1000}} \qquad \text{[Math 2]}$$

FIG. 6 shows the first absorbed irradiance $$E_A^{ABS}$$

represented as a solid line, the second absorbed irradiance $$E_B^{ABS}$$

represented as a thin dashed line and the total absorbed irradiance $E^{ABS}$ represented as a heavy dashed line, as a function of the absorbed photon flux ratio $\phi_A/\phi_B$. Short wavelength photons are more energetic than long wavelength photons, resulting in an increase in total absorbed irradiance $E^{ABS}$ as the first photon flux $\phi_A$ increases. When radiation 20 only comprises photons of wavelengths equal to 1000 nm, that is when the first absorbed photon flux $\phi_A$ is zero, the total absorbed irradiance $E^{ABS}$ is minimal and substantially equal to 1.8 kW/m². When the radiation 20 only comprises photons of wavelengths equal to 400 nm, that is when the first absorbed photon flux $\phi_A$ is 100%, the total absorbed irradiance $E^{ABS}$ is maximum and substantially equal to 4.4 kW/m².

The first photon flux $\phi_A$ preferably has photons with wavelengths between nm and 550 nm. The second photon flux $\phi_B$ preferably has photons with a wavelength between 550 nm and 1100 nm. Advantageously, the wavelength of the second photon flux $\phi_B$ is between 800 nm and 1100 nm.

FIG. 7 shows the result of a simulation of the temperature change of a stack 10' as a function of the absorbed power density (or total absorbed irradiance) $E^{ABS}$ of radiation 20. The total absorbed irradiance $E^{ABS}$ varies as a function of the ratio of absorbed photon fluxes $\phi_A/\phi_B$ which is plotted on a second scale. When the flux ratio $\phi_A/\phi_B$ is less than or equal to 70/30, the temperature of the stack is kept at or below 200° C. for the entire treatment duration t. It is therefore not necessary to employ a cooling system to control temperature of the stack 10'. For example, when the flux ratio $\phi_A/\phi_B$ is 10/90, the temperature reached by the stack 10' is less than 170° C.

When the flux ratio $\phi_A/\phi_B$ is greater than 70/30, the stack temperature is above 200° C. In this case, it may be necessary to resort to a cooling system in order to lower the temperature of the stack 10' and limit the risk of degradation of the amorphous silicon layers 12, 13, 14. The cooling system may implement one or more heat transfer mechanisms such as the emission of thermal radiation, natural convection with the ambient air or even thermal conduction with the substrate 30.

When the flux ratio $\phi_A/\phi_B$ exceeds 70/30, the temperature of the stack 10' is above 200° C., for at least part of the treatment duration t. For example, when the flux $\phi_A/\phi_B$ is 100/0, the temperature of the stack 10' is around 218° C. at the end of the treatment. It is therefore preferable to implement a cooling system to keep the temperature of the stack 10' below 200° C. for the treatment duration or to reduce the time when the stack temperature exceeds 200° C. The cooling system can consist of a circulation of a heat transfer fluid within the support 30, contacting the stack 10' with Peltier elements or the forced circulation of a gas allowing heat to be removed by forced convection. In this way, degradation of the amorphous silicon layers 12, 13, 14 can be avoided or reduced. In any case, it will be ensured that the temperature of the stack 10' remains below 320° C., above which the amorphous silicon layers 12, 13, 14 are irremediably degraded.

The implementation of radiation 20 with a photon flux ratio of less than 70/30 is an excellent compromise between the total photon flux $\phi_T$ absorbed by the stack 10' and its heating.

Indeed, the stack 10' may also have a critical temperature of between 218° C. and 250° C., allowing treatment to be carried out without the need for a cooling system.

According to one embodiment, the electromagnetic radiation 20 consists of a first component and a second component. The first component is advantageously between 300 nm and 550 nm and the second component is advantageously between nm and 1100 nm. The first and second components correspond, for example, to the ranges A and B illustrated in FIG. 3. Each wavelength preferably belongs to one of the two components. For example, the at least one first wavelength belongs to the first component. Similarly, the at least one second wavelength belongs to the second component.

In order to control heating of the stack to be treated, as illustrated in FIGS. 6 and 7, it is advantageous to expose said stack to radiation comprising at least one monochromatic component. In other words, the first and/or second component may be monochromatic. By monochromatic, it is meant that the component comprises only one wavelength. Conversely, by polychromatic, it is meant that the component comprises a plurality of wavelengths. More specifically, a component can be considered monochromatic when it only comprises a line with a full width at half-maximum of less than or equal to 10 nm. Furthermore, it is preferable that the line has:

a maximum spectral irradiance greater than 0.04 W/m²/ nm, and a minimum spectral irradiance of less than or equal to 0.04 W/m²/nm.

A component can be considered polychromatic if it comprises:

a line with a full width at half-maximum greater than 10 nm;

a plurality of lines; or a spectral irradiance greater than 0.04 W/m²/nm over a wide spectral range.

In particular, FIGS. 6 and 7 show simulation results in which the two components of the electromagnetic radiation implemented are monochromatic. Indeed, the first component has a first single wavelength at 400 nm and the second component has a second single wavelength at 1000 nm.

Thus, the first irradiance measured between 300 nm and 550 nm can be associated with the first component. Similarly, the second irradiance measured between 550 nm and 1100 nm can be associated with the first component.

Moreover, it is advantageous that the second irradiance is measured over the same range as the second component. Thus, when the radiation has a third irradiance, then the second component can be between 800 nm and 1100 nm to exactly match the range over which the second irradiance is measured. According to this example, the electromagnetic radiation consists of:

the first component extending between 300 nm and 550 nm; and the second component extending from 800 nm to 1100 nm.

Apart from the first and second components, the electromagnetic radiation is preferably negligible, that is it has a spectral irradiance of less than 0.04 W/m²/nm.

Similarly, the first photon flux, with a wavelength between 300 nm and 550 nm, may be associated with the first component. The second photon flux, with a wavelength between 550 nm and 1100 nm, or even 800 nm and 1100 nm, may be associated with the second component.

In order to increase treatment kinetics while avoiding the implementation of a cooling system, one particular embodiment of the treatment method provides for the treatment of a stack 10' with radiation 20 only comprising photons with a wavelength between 300 nm and 550 nm, for example 400 nm, the radiation having a high total irradiance E, for example greater than or equal to 200 kW/m, and the treatment duration being less than or equal to 12 s. This mode of implementation makes it possible to take advantage of the treatment effectiveness offered by short wavelengths while controlling the temperature of the stack 10'. Advantageously, the treatment duration t can be reduced in order to reduce heating of the stack 10' so that its temperature is kept below 200° C. or briefly between 200° C. and 320° C. In this example, the substrate 11 may be n-type doped.

The treatment duration t can also be advantageously reduced in order to reduce heating of the stack 10' so that its temperature is kept below its critical temperature or briefly between the critical temperature and the maximum temperature.

For example, the electromagnetic radiation exposure step can be continuous, that is performed at once, if the treatment duration t and the total irradiance E of the electromagnetic radiation 20 are such that the temperature of the stack 10' does not exceed 200° C. (possibly using the cooling system). If the treatment duration t and the total irradiance E of the radiation are such that the stack temperature exceeds 200° C. (for example $\phi_A/\phi_B=100/0$), in the absence of cooling system or if the cooling system is insufficient, the exposure step can be carried out in sequences, that is divided into several exposure phases which are separated by cooling phases (for example by natural or forced convection). The treatment duration t is then reached in N exposure phases of x seconds (N being a positive natural number and x a positive real number). The choice between continuous or sequential implementation of the exposure step may also depend on the critical temperature.

In a preferential implementation of the treatment method, the total irradiance E of the electromagnetic radiation 20 is greater than or equal to 1000 kW/m² and the treatment duration t is advantageously less than or equal to 2.5 seconds.

An exposure time of less than or equal to 2.5 s makes it possible to relieve stresses on the implementation of the method in particular on the thermal management of the stack 10'. This may allow the exposure step to be carried out at once, to reduce the number of phases in the case of a sequential exposure step or to use a less efficient (and therefore less expensive) cooling system.

For example, amorphous silicon in the stack 10' can withstand a temperature of about 320° C. for about 0.2 second (after which it suffers irreversible damage). It may therefore be contemplated to carry out the exposure step sequentially, with phases of duration equal to 0.2 s, if necessary keeping the temperature of the stack below 320° C.

The treatment method described above can be performed at different stages of the manufacture of a heterojunction photovoltaic cell. A heterojunction photovoltaic cell refers to a photovoltaic cell made from a crystalline silicon substrate. The substrate can be n-type or p-type doped. This photovoltaic cell can be a single-face or dual-face cell. In a single-face cell, only the front face collects solar radiation. In a dual-face cell, the front and back faces each collect a part of the solar radiation. The front face collects incident (that is direct) radiation while the back face collects diffuse or reflected radiation. The front face of a dual-face cell is the one that allows the maximum electric current to be obtained when it points to the incident radiation. The emitter of the n-type heterojunction photovoltaic cell, that is the p-type doped amorphous silicon layer, can be located on the front face or the back face of the cell. The latter is referred to as an inverted emitter heterojunction photovoltaic cell.

In general, the method for manufacturing a heterojunction photovoltaic cell comprises (referring to FIG. 1):

depositing a first passivation layer 14 of hydrogenated amorphous silicon (preferably intrinsic) onto a first face of the substrate 11;

depositing a first layer 12 of n-doped (and preferably hydrogenated) amorphous silicon onto the first passivation layer 14;

depositing a first transparent conductive oxide layer 15 onto the first layer 12 of doped amorphous silicon; and forming at least one collecting electrode 16 on the first transparent conductive oxide layer 15;

depositing a second passivation layer 14 onto a second opposite face of the substrate 11;

depositing a second layer 13 of amorphous, p-doped (and preferably hydrogenated) silicon onto the second passivation layer 14.

The manufacture of a dual-face photovoltaic cell, such as the photovoltaic cell 10 illustrated in FIG. 1, further comprises depositing a second transparent conductive oxide layer 15 onto the second layer 13 of doped amorphous silicon and forming at least one collecting electrode 16 onto the second transparent conductive oxide layer 15.

In order not to complicate the method for manufacturing the photovoltaic cell by creating an additional step, the treatment method is advantageously integrated into an already existing step. For example, the stack comprising the substrate 11, the first passivation layer 14 and the first layer 12 of doped amorphous silicon can be illuminated upon depositing the first transparent conductive oxide layer 15. The stack may also be illuminated upon depositing the n-doped amorphous silicon layer.

The stack can also be illuminated upon depositing the second transparent conductive oxide layer 15 onto the second layer 13 of doped amorphous silicon. The interface between each transparent conductive oxide layer and the underlying doped amorphous silicon layer can thus be improved.

The stack may also be illuminated upon forming the collecting electrodes 16 on the first transparent conductive oxide layer 15 or, in the case of a dual-face cell only, on the second transparent conductive oxide layer 15. The formation of the collecting electrodes 16 generally comprises two operations:

a first operation of depositing a metal paste onto the (first and/or second) conductive transparent oxide layer 15 by screen printing; and a second operation of hardening the metal paste, for example by means of heat treatment, in order to decrease resistivity of the (metal) collecting electrodes.

This second operation of hardening the metal paste and the stack exposure step are advantageously performed simultaneously. Heat produced by the illumination thus contributes to the hardening of the metal paste.

The treatment method can also be applied to a heterojunction photovoltaic cell in its final state (after the formation of the collecting electrodes 16 on the conductive transparent oxide layer(s) 15).

In the scope of the manufacture of a so-called interdigitated back contact (IBC) photovoltaic cell, the IBC cell comprises a first and a second passivation layer deposited onto the first and second faces of a substrate, respectively. An anti-reflective treatment layer can be deposited onto the second passivation layer. The second face of the substrate is the front face of the IBC and is to receive solar radiation. Alternating layers of p-type and n-type doped amorphous silicon are deposited next to each other onto the first passivation layer, that is on the back face of the IBC. A plurality of conductive transparent oxide layers may be deposited, each onto one of the doped amorphous silicon layers. Metallisations may also be deposited onto each transparent conductive oxide layer to enable the IBC to be electrically connected. It may be advantageous to treat the IBC prior to the deposition of the conductive transparent oxide layers. The first face of the substrate, that is the back face of the IBC, points to the radiation source. Exposing the conductive transparent oxide layers prior to the deposition of the metallisations makes it possible to improve quality of these layers and thus to reduce the series resistance of the IBC. Exposing the conductive transparent oxide layers after the deposition of the metallisations makes it possible to improve the interface between said layers and the metallisations, further reducing the series resistance of the IBC.

In the scope of the manufacture of so-called "tandem" cells comprising a first perovskite-based cell (so-called "upper" cell) disposed on a silicon heterojunction cell (so-called "lower" cell), it may also be advantageous to treat the heterojunction cell before the deposition of the perovskite cell, both to improve the passivation layers of the heterojunction cell and to improve the future interface between both cells. In this case, the treatment method may occur at the end of the heterojunction cell manufacturing or during one of the heterojunction cell manufacturing steps.

Alternatively, the treatment method can be applied after the deposition of the perovskite cell onto the silicon heterojunction cell, provided that a treatment temperature of less than 200° C., preferably substantially 100° C., is kept.

Finally, the treatment method can also be applied to a photovoltaic module, provided that the temperature of the treatment method is compatible with the constituent elements of the module. The photovoltaic module comprises at least two silicon heterojunction (SHJ) photovoltaic cells electrically connected to each other, either directly or within a photovoltaic chain comprising at least one other SHJ cell. The SHJ cells are for example of the same type as in FIG. 1 and further comprise:

a crystalline silicon substrate;

a first passivation layer of hydrogenated amorphous silicon, disposed on a first face of the substrate; and a first layer of amorphous, n-type doped silicon, disposed on the first passivation layer.

The method for treating a module includes a step of exposing each stack of SHJ cells to electromagnetic radiation. Each first face of the substrate points to a source of electromagnetic radiation. This may be a point, line or extended source, being fixed or swapping the surface of the module. For example, all SHJ cells may have their first faces on one of the faces of the photovoltaic module, in which case only one performance of the exposure step is necessary. Alternatively, and in particular in the case of dual-face cells, the SHJ cells may be alternated within the module, successively having the first face of the substrate or the second face of the substrate. In this case, the treatment method advantageously repeats the exposure step on each face of the photovoltaic module in order to expose each first face of the substrate.

The exposure step implemented in the cell manufacturing or module treatment method is advantageously identical to the exposure step of the stack treatment method. The electromagnetic radiation implemented in each exposure step of the module treatment method is advantageously the same as that implemented in the stack treatment method. Thus, all the implementation modes and all the characteristics of the stack treatment method previously described are applicable to the module treatment method.

The invention claimed is:

1. A method for treating a stack, the stack comprising:

a substrate of crystalline silicon;

a first passivation layer of hydrogenated amorphous silicon, disposed on a first face of the substrate; and a first layer of n-doped amorphous silicon, disposed on the first passivation layer;

the method comprising a step of exposing the stack to electromagnetic radiation emitted by an electromagnetic radiation source, the first face of the substrate pointing to the electromagnetic radiation source, the electromagnetic radiation having at least one first wavelength between 300 nm and 550 nm and at least one second wavelength between 800 nm and 1100 nm, wherein the electromagnetic radiation has a spectral irradiance between 550 nm and 800 nm less than or equal to 0.04 W/m$^2$/nm.

2. The method according to claim 1, wherein the electromagnetic radiation consists of a first component and a second component, the first component being between 300 nm and 550 nm, and the second component being between 550 nm and 1100 nm, at least one of the first and second components being monochromatic.

3. The method according to claim 1, wherein the electromagnetic radiation has:

a first irradiance measured over the wavelength range between 300 nm and 550 nm;

a second irradiance measured over the wavelength range between 550 nm and 1100-nm; and a total irradiance measured over the wavelength range between 300 nm and 1100 nm;

the first irradiance being greater than 10% of the total irradiance.

4. The method according to claim 3, wherein the first irradiance is measured over the wavelength range between 400 nm and 550 nm.

5. The method according to claim 1, wherein the electromagnetic radiation comprises a first photon flux having a wavelength between 300 nm and 550 nm and a second photon flux having a wavelength between 550 nm and 1100 nm, a ratio of the first photon flux to the second photon flux being less than or equal to 70/30.

6. The method according to claim 5, wherein the electromagnetic radiation comprises a total photon flux equal to a sum of the first photon flux and the second photon flux, the total photon flux being greater than or equal to $8.95161 \times 10^{21}$ photon/m$^2$/s.

7. The method according to claim 1, wherein a temperature of the stack is less than 320° C. during the step of exposing the stack to electromagnetic radiation.

8. The method according to claim 1, wherein the step of exposing the stack to electromagnetic radiation is continuous.

9. The method according to claim 1, wherein the step of exposing the stack to electromagnetic radiation is performed in sequences.

10. The method according to claim 1, wherein the stack further comprises a conductive transparent oxide layer disposed on the first layer of n-doped amorphous silicon.

11. The method according to claim 1, wherein the stack comprises:

a second passivation layer of hydrogenated amorphous silicon, disposed on a second face of the substrate, the second face of the substrate being opposite to the first face of the substrate; and a second layer of p-doped amorphous silicon, disposed on the second passivation layer.

12. The method according to claim 1, wherein the stack further comprises a second layer of p-type doped amorphous silicon, the second layer of p-doped amorphous silicon being also disposed on the first passivation layer.

13. A method for manufacturing a silicon heterojunction cell, comprising:

forming a stack by depositing a first hydrogenated amorphous silicon passivation layer onto a first face of a crystalline silicon substrate and a first layer of n-doped amorphous silicon onto the first hydrogenated amorphous silicon passivation layer; and exposing the stack to electromagnetic radiation emitted by an electromagnetic radiation source, the first face of the substrate pointing to the electromagnetic radiation source, the electromagnetic radiation having at least one first wavelength between 300 nm and 550 nm and at least one second wavelength between 800 nm and 1100 nm, wherein the electromagnetic radiation has a spectral irradiance between 550 nm and 800 nm less than or equal to 0.04 W/m$^2$/nm.

14. A method for treating a photovoltaic module, the photovoltaic module comprising at least two electrically connected silicon heterojunction photovoltaic cells, each silicon heterojunction photovoltaic cell comprising a stack, the stack comprising:

a crystalline silicon substrate;

a first passivation layer of hydrogenated amorphous silicon, disposed on a first face of the substrate; and a first layer of n-type doped amorphous silicon, disposed on the first passivation layer;

the method for treating the photovoltaic module comprising a step of exposing each stack to electromagnetic radiation emitted by an electromagnetic radiation source, each first face of the substrate pointing to the electromagnetic radiation source, the electromagnetic radiation having at least one first wavelength between 300 nm and 550 nm and at least one second wavelength between 800 nm and 1100 nm, wherein the electromagnetic radiation has a spectral irradiance between 550 nm and 800 nm less than or equal to 0.04 W/m$^2$/nm.

* * * * *